United States Patent [19]

Smith et al.

[11] Patent Number: 4,870,348
[45] Date of Patent: Sep. 26, 1989

[54] MARKERS FOR READOUT AND DELTA-PARAMETER MEASUREMENTS ON A QUASI-3-DIMENSIONAL DISPLAY OF A SPECTRUM

[75] Inventors: Michael D. Smith, Beaverton; Stuart H. Rowan, Hillsboro; Robert S. Vistica, Aloha; Steven R. Morton, Beaverton, all of Oreg.

[73] Assignee: Tektronix, Inc., Beaverton, Oreg.

[21] Appl. No.: 204,435

[22] Filed: Jun. 9, 1988

[51] Int. Cl.$^4$ ............................................. G01R 23/16
[52] U.S. Cl. ................................. 324/77 B; 324/78 D
[58] Field of Search ................ 374/77 B, 77 C, 78 D, 374/121 R; 364/485, 487; 340/709

[56] References Cited

U.S. PATENT DOCUMENTS

| | | | |
|---|---|---|---|
| 4,253,152 | 2/1981 | Holdaway | 324/77 B |
| 4,306,186 | 12/1981 | Nakazawa et al. | 324/77 B |
| 4,649,496 | 3/1987 | Anderson et al. | 324/77 B |
| 4,761,640 | 8/1988 | Slavin | 364/487 |

OTHER PUBLICATIONS

Scientific-Atlanta, Instrumentation Products Catalog, 1983, p. 139.
Hewlett-Packard, Model 3561A Dynamic Signal Analyzer Operating Manual, Nov. 1983, pp. 88–91.
Tektronix, 1240 Operator's Manual, 1982, p. 5-1 to 5-2.
Robert S. Wolff, The Visualization Challenge in the Physical Sciences, Jan. 1988, Computers in Science, vol. 2, No. 1, pp. 18 & 19.
Marconi Instruments, Ltd. 100 m Hz–400 MHz, Spectrum Analyzer and Display 2382/2380, 1986, pp. 1–3, 3-11, 3-12 and 3-46 to 3-48.

Primary Examiner—Tom Noland
Assistant Examiner—Louis M. Arana
Attorney, Agent, or Firm—Boulden G. Griffith

[57] ABSTRACT

An apparatus and method of using markers for identifying particular points on a quasi-3-dimensional display, such as a color spectrogram display or a waterfall display of multiple frequency spectra on an electronic spectrum analyzer, so that amplitude, time, and frequency values associated with a particular point can be conveniently read out, and so that differences in amplitude, time, and frequency between two points can be easily calculated and presented to the user. Two markers whose positions are ascertainable are generated on the quasi-3-dimensional display and are made subject to operator control. One of these markers is positioned by the operator on a particular point of interest and the values associated with that location are then displayed for readout with greater precision and convenience than would otherwise be possible. A second marker is placed at a second point of interest and the differences in the values of amplitude, time, and frequency between the two points are calculated and displayed.

5 Claims, 5 Drawing Sheets

MARKERS FOR READOUT AND DELTA-PARAMETER MEASUREMENTS ON A QUASI-3-DIMENSIONAL DISPLAY OF A SPECTRUM

BACKGROUND OF THE INVENTION

This invention relates to the field of displays for electronic spectrum analyzers, and more particularly to a system of markers for use in reading out amplitude, frequency and time values and making comparisons between the values at two locations in a quasi-3-dimensional display of multiple frequency spectra of a time varying electronic signal under analysis.

Spectrum analyzers, also known as signal analyzers, are electronic instruments that provide frequency domain information about time varying electronic signals under analysis. Such instruments monitor an electronic signal to obtain time domain information, and then transform the time domain information into frequency domain information for presentation to a user. The user sees a series of amplitude versus frequency spectra that describe how the energy of the signal is distributed in terms of the different frequency components that make up that signal.

Time domain information consists of a series of amplitude measurements made at regular intervals. In the digital spectrum analyzer in which the present invention was first implemented, an analog input signal is sampled at regular intervals and the voltage present at each of these times is converted into a digital word. A discrete Fourier transformation (DFT) is then performed on a segment of this digitized time domain data in order to calculate the corresponding frequency domain information. Usually, some variation of the fast Fourier transform (FFT) is used to accomplish the DFT calculation.

Once this frequency domain information has been produced by the spectrum analyzer, it is usually displayed as an amplitude versus frequency graphical representation on some sort of display device, such as a raster scan display screen. It is well known to use a system of markers to perform readouts and delta-parameter measurements on this type of display.

If the spectrum analyzer is continuously monitoring a certain band of frequencies, it is desirable to be able to see a history of the spectra generated by the analyzer over time. This allows an operator to visually compare these numerous spectra with each other to identify changes in the signal that are occurring over longer periods of time than the sampled interval used to calculate the individual spectra. This can be accomplished by storing each spectrum after it is calculated and first displayed, and then redisplaying a number of these spectra in some way that allows an operator to monitor them simultaneously and make comparisons.

The digital spectrum analyzer in which the present invention first found embodiment is capable of producing two types of quasi-3-dimensional displays: waterfall displays and color spectrogram displays. A waterfall display consists of a large number of amplitude versus frequency spectral displays closely stacked together, providing for ready comparison between their features. In this display time and amplitude share an axis, creating an illusion of a third dimension through the appearance of a relief drawing.

The color spectrogram display shows a number of spectra which were generated over time as a series of colored lines. Color is used as a substitute for a third dimension, permitting numerous frequency spectra to be compressed into a small area and readily compared by the user. Each single line of the spectrogram display is a complete spectrum, with different frequencies being represented by different points along the line and the color of each point representing the amplitude of the signal at that frequency. The other axis represents time, with the individual complete spectra moving along this axis as successive spectra are calculated by the spectrum analyzer. Thus, in a dynamic mode of operation, as a new spectrum appears at one end of this display, all of the previously displayed spectra are moved up one line along the time axis, with the spectrum which represents the oldest data disappearing from the other end of the display (after the display is filled). In a static mode of operation, this flow of spectra is stopped for detailed analysis, or a series of spectra previously generated are recalled from memory and displayed for further analysis.

In the digital spectrum analyzer that embodies the present invention, the spectrogram display is adjacent to and aligned with an amplitude versus frequency display, so that the two displays share the same frequency axis. In this dual display, the amplitude versus frequency portion of the display may be seen as a detailed view of the current edge of the color spectrogram portion of the display. Alternatively, the spectrogram portion of the display may be viewed as a compressed history of the contents of the amplitude versus frequency portion of the display.

The color of each point on the spectrogram display indicates the amplitude or power of the signal at a particular frequency and time. The values on the time axis represent the times at which the time domain data was collected relative to a common reference time. The values along the frequency axis represent the different frequency bins of the FFT output. Because it is difficult for an operator to accurately locate the position along each axis that corresponds to a particular point of interest out in the middle of the spectrogram display, and because reading out values on these axes requires operator interpolation and the precision of any resulting reading is necessarily limited, what is desired is a way to read out precise values of amplitude, time, and frequency for particular points on the quasi-3-dimensional display to a desired level of precision and with a minimum of operator effort. What is also desired is a way to conveniently make comparisons in the values of amplitude, time, or frequency between any two points on the quasi-3-dimensional display.

SUMMARY OF THE INVENTION

The present invention is an apparatus and method for identifying particular points on a quasi-3-dimensional display, such as a color spectrogram display or a waterfall display of multiple frequency spectra on an electronic spectrum analyzer, so that the amplitude, time, and frequency values associated with a particular point can be conveniently read out, and so that differences in amplitude, time, and frequency between two points can be easily calculated and presented to the user. Two markers whose positions are ascertainable are generated on the quasi-3-dimensional display and are made subject to operator control. One of these markers is positioned by the operator on a particular point of interest and the values associated with that location are then displayed for readout with greater precision and convenience than would otherwise be possible. A second marker is placed at a second point of interest and the differences in the values of amplitude, time, and frequency between the two points are calculated and displayed.

DETAILED DESCRIPTION

Figure 1:
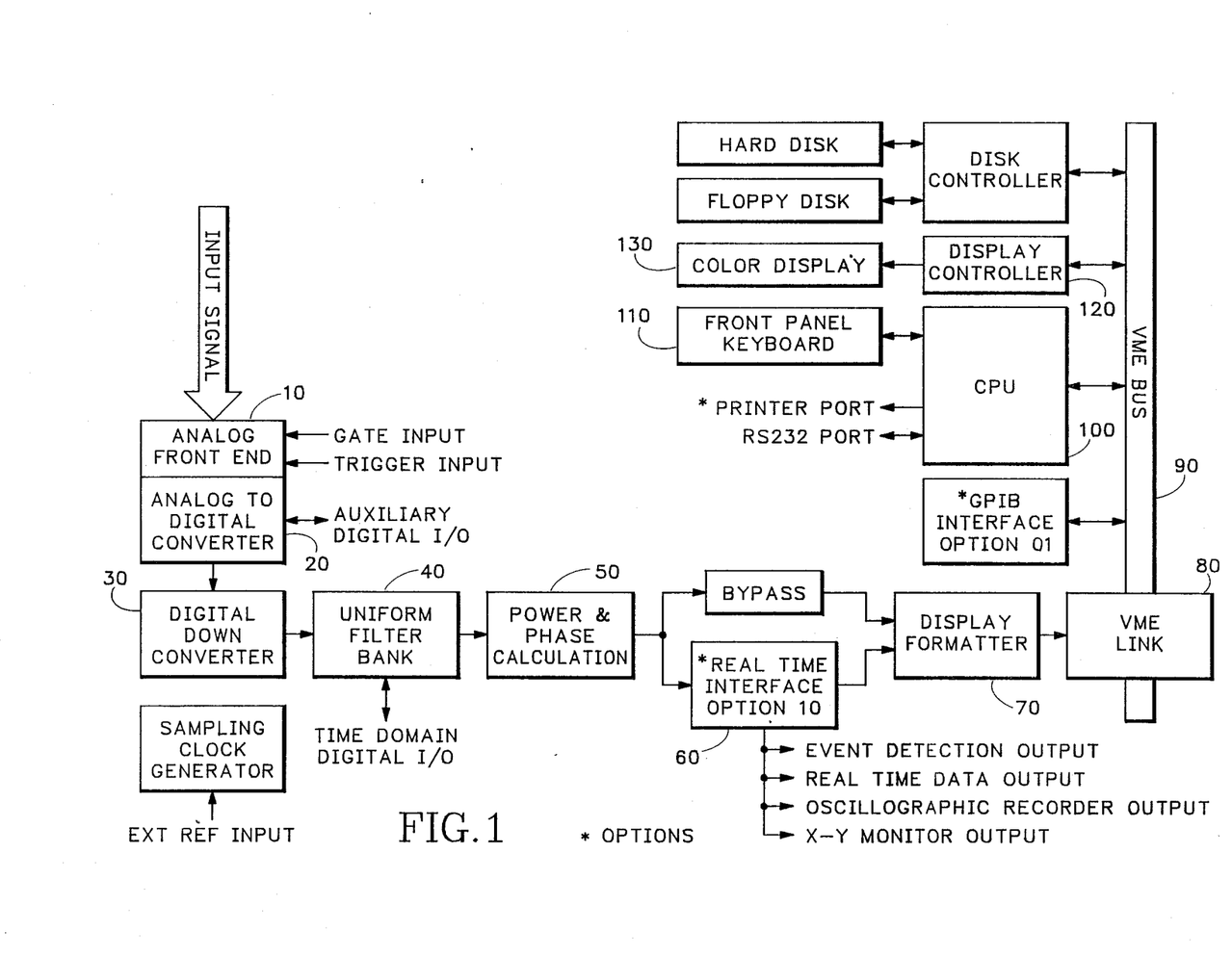
FIG. 1 is a block diagram of a digital spectrum analyzer.

Referring to FIG. 1, time varying electronic signal under analysis is the input signal to an Analog Front End 10 of spectrum analysis instrument. The Analog Front End 10 provides attenuation and amplification as required by the level of the input signal, and has facilities for gating the input or responding to an external trigger. The Analog to Digital Converter 20 turns the conditioned analog input into a series of digital words describing the amplitude of the signal as it is sampled at a rate of 25.6 mega samples per second, providing a useful input signal bandwidth of 10 MHz.

Digital Down Converter 30 shifts the 10 MHz input bandwidth down by a selectable frequency between 500 Hz and 9.9995 MHz., then performs a low pass filtering process on the resulting complex signal, and provides the filtered output, suitably decimated, to the Uniform Filter Bank 40 which includes a fast Fourier transformation (FFT) processor.

It should be understood that to convert information in the time domain to frequency domain description of the activity of the signal, a digital spectrum analyzer performs a Fourier transformation by some variation on the method known as discrete Fourier transform (DFT). Usually this DFT is accomplished using one of the algorithms known as fast Fourier transforms (FFT). Numerous patents, textbooks, and articles in the literature describe the FFT and its variations. However, all methods of performing the FFT require a certain minimum amount of time and the application of some amount of computing resources. In the instrument being described this function resides in the Uniform Filter Bank 40.

The output of the Uniform Filter Bank 40 is 1024 complex signals describing the frequency distribution of the input during one frame, each frame consisting of 1024 bins of spectral information. This raw spectral data is then input to the Power & Phase Calculation circuitry 50, which produces 1024 power levels and 1024 phase angles describing each of the 1024 bins in the spectral frame in terms of power and phase angle. The optional Real Time Interface 60 puts this power and phase information in several forms for output to other devices.

The Display Formatter 70 performs a variety of data reduction operations on the stream of power and phase information coming from the Power & Phase Calculation circuitry 50. Because the display mechanism, and for that matter the human eye and mind, are incapable of coping with a new display every 200 usec (which is the maximum rate that they can be generated), it is necessary to perform some sort of data reduction in order to permit the operator to assimilate the data in real time. The Display Formatter 70 therefore performs data reduction in one of several ways selectable by the operator. Frames can be discarded according to some decimation factor, R. Several frames can be averaged to produce a single frame summary of what has transpired. Peak or minimum values may also be selected.

Figure 2:
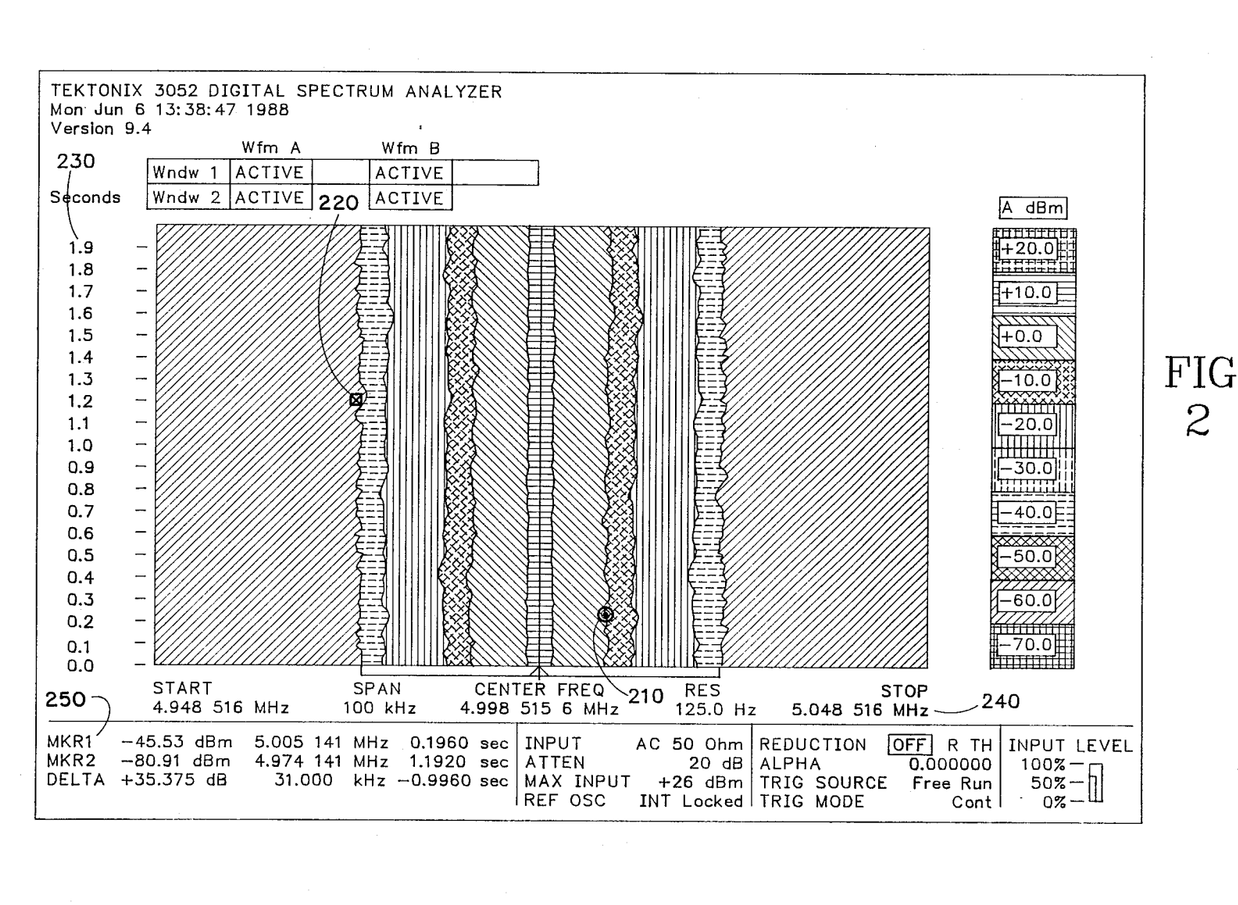
FIG. 2 is an illustration of the color spectrogram display with the markers of the present invention disposed thereon and readouts of parameter values at the marker locations displayed.

Referring now to FIG. 2, a color spectrogram is shown with two markers 210 and 220 of the present invention displayed within it. A number of spectra are aligned along a vertical time axis 230, while the frequencies that they describe are shown on the horizontal frequency axis 240. The amplitude values of the spectra at each frequency are shown by colors. The time axis 230 is labeled with a time that represents the interval between the calculation of the frequency spectrum at that point and the time of the calculation of the frequency spectrum at the bottom of the display.

Figure 3:
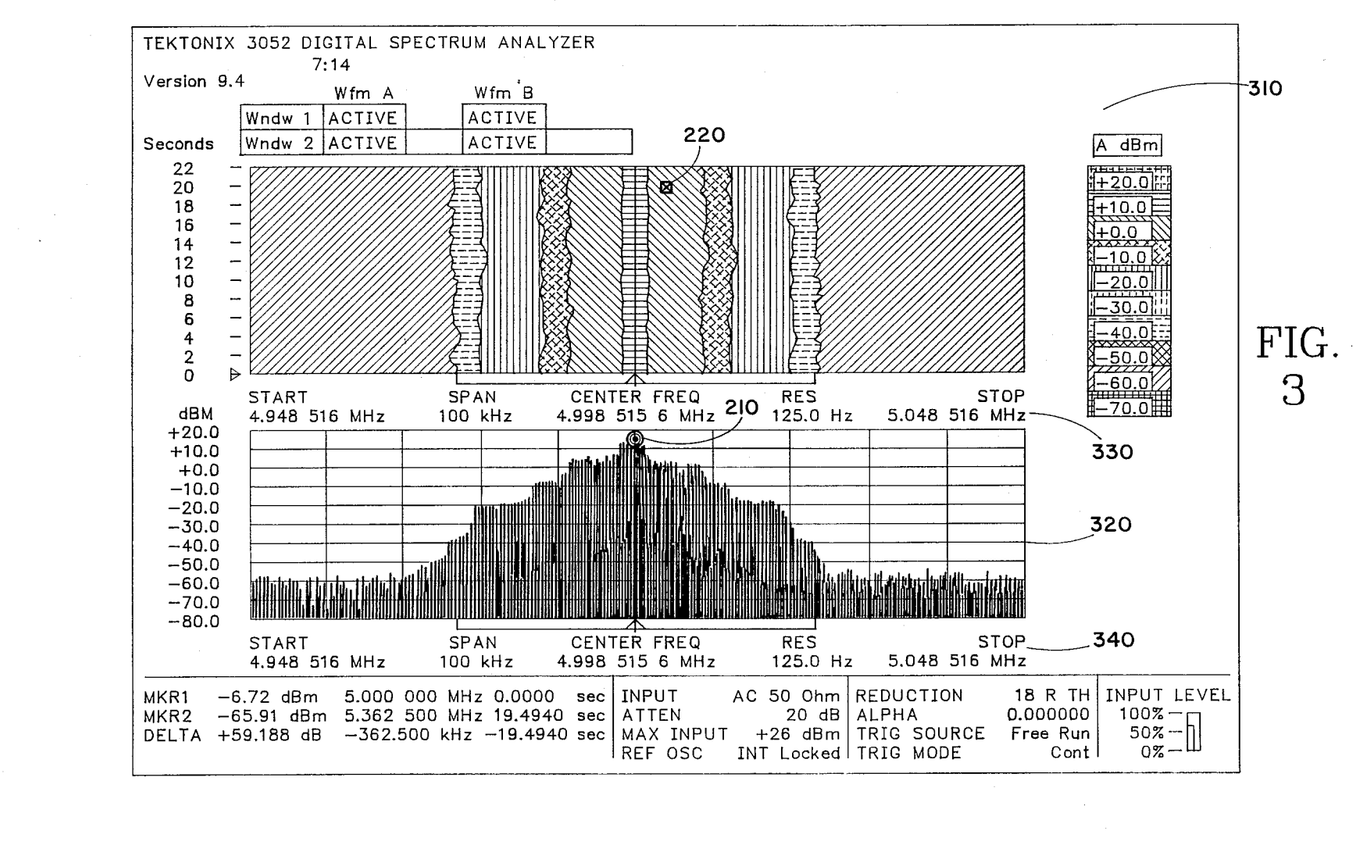
FIG. 3 is an illustration of a dual display containing both a color spectrogram display of multiple spectra and an amplitude versus frequency display of a single spectrum with the secondary marker in the spectrogram display and the primary marker in the amplitude versus frequency display.

Referring now to FIG. 3, a dual display option is available in the spectrum analyzer being described that provides a spectrogram display 310 vertically aligned with an amplitude versus frequency display 320, so that the two displays are disposed along equivalent frequency axes 330 and 340. The scale and center frequency of this frequency axis may be commonly controlled. In this dual display, the amplitude versus frequency display 320 may be seen as a detailed view of the current edge of the color spectrogram display 310, which in turn may be viewed as a compressed history of the contents of the amplitude versus frequency display 320.

In FIG. 2, the location of the primary marker 210 is shown by a light-colored bulls-eye, while the location of the secondary marker 220 is shown by a light-colored box with an X in it. Readouts 250 at the bottom left of the display indicate the absolute and relative values of the amplitude, time, and frequency values at the locations of the two markers 210 and 220.

Referring again now to FIG. 3, the secondary marker 220 is on the spectrogram display and the primary marker 230 is on the amplitude versus frequency display. Since the spectrum displayed in the amplitude versus frequency display is not the same one that the secondary marker is on in the spectrogram display, there is a delta-time value displayed which represents the time between the generation of these two spectra.

Figure 5:
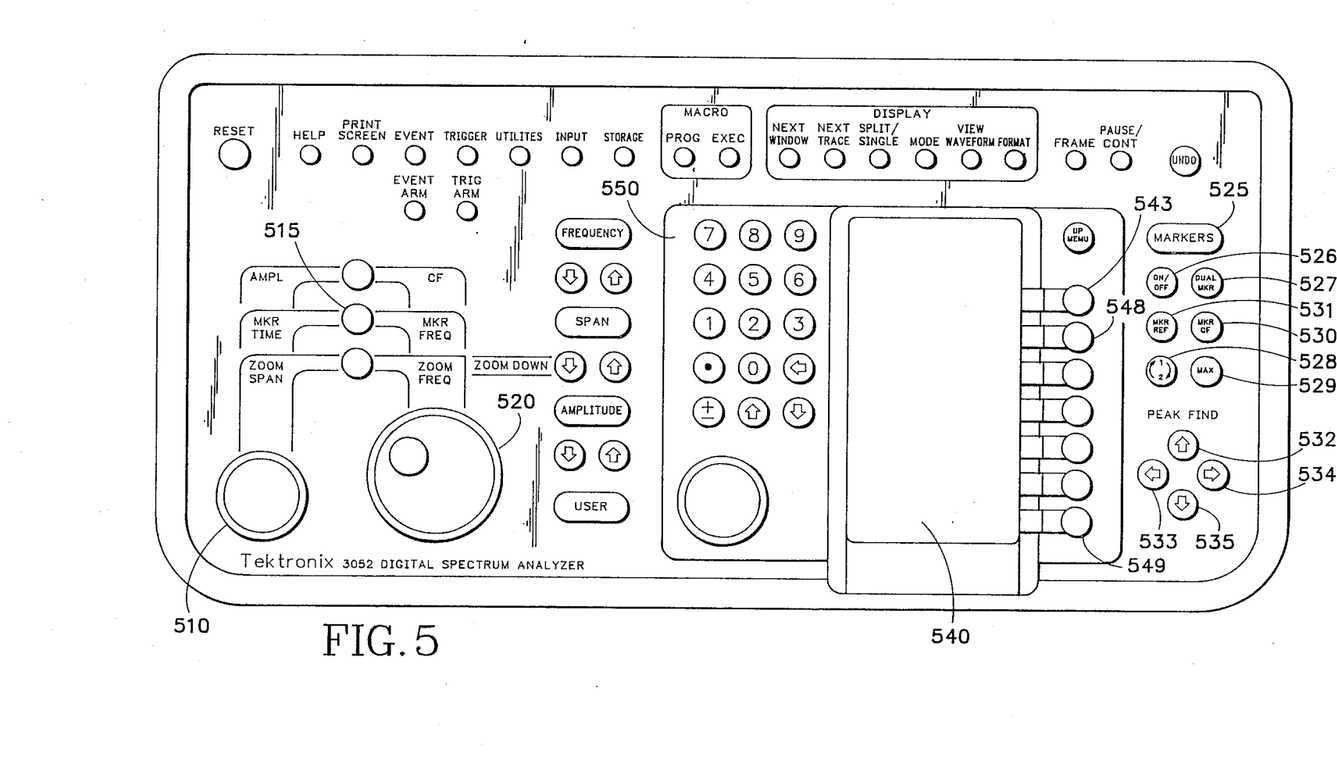
FIG. 5 is a diagram of the front panel of the digital spectrum analyzer embodying the present invention.

The locations of both markers are controlled by moving the primary marker and exchanging markers. That is, only the primary marker may be moved directly. The secondary marker is used to mark a location, so that the primary marker can measure the relative difference in some parameter between this fixed secondary marker and the movable primary one. Referring to FIG. 5, when one wants to move the secondary marker, the exchange markers 1→2,2→1 push button 528 is momentarily depressed, causing the markers to be interchanged, i.e., the primary marker appears at the location previously occupied by the secondary marker, while the secondary marker appears at the location previously occupied by the primary marker.

When the Span and Frequency controls are used to change the bandwidth or center frequency of the spectrum analyzer, the markers behave as follows: the secondary marker remains fixed in frequency even though this may mean that its physical location on the screen has to change, and the primary marker remains physically fixed on the screen, even though this may mean that its location in frequency has to change.

Referring again to FIG. 5, there are a variety of ways to affect the location of the primary marker. Rotating knob controls 510 and 520 operate to control marker position when they are put in this mode of operation by the MKR TIME/MKR FREQ button 515. Once activated in this way, the MKR TIME control knob 510 allows the markers to be moved along the time axis, while the MKR FREQ control knob 520 allows the markers to be moved along the frequency axis.

Numerous other controls 525–535 also affect marker operation. The marker ON/OFF push button 526 turns the primary marker on and off, and will turn off both markers if they are both on when it is depressed. The DUAL MKR push button 527 is used to turn the secondary marker on and off. The primary and secondary markers are interchanged by operation of the 1→2,2→1 push button 528.

The MAX push button 529 causes the primary marker to go to the highest peak in the display. The marker can also be identified as a reference point about which the "span" of the analyzer can be centered by pressing the MKR→CF push button 530. The MKR→REF push button 531 changes the reference level (the top of the screen amplitude value) to the amplitude level at of the present location of the primary marker.

Four PEAK FIND push buttons 532–535 are direction arrows which allow the operator to direct the marker to the next higher peak 532, the next lower peak 535, the next peak to the left 533, or the next peak to the right 534. Decisions made in the Primary Marker Menu, to be discussed below, control which axis, time or frequency, or the whole field, that these searches are conducted along.

The large MARKER push button 525 provides access to a Primary Marker Menu which appears in the menu area 540. Once within this menu, pressing the button 543 to the right of the first field in this menu, the ENTER VALUE field, takes the operator to an Enter Value secondary menu where he may then enter a frequency value for the desired location of the primary marker using the numbered buttons in the keyboard area 550. Another field in the Primary Marker menu, the MARKER SHAPE field, which is activated by the next button 548, allows the operator to select the graphic representation that will be used to indicate the location of the marker. While a spectrogram display is active, the choices are a box, bars (extended crosshairs), and a bulls-eye. While a waterfall display is active there are only a box or bars.

The PARAMETERS choice in this menu, activated by the last button to the right 549, provides access to the Parameters secondary menu. This menu provides access to a variety of controls for marker functions, many of which are not very important to the present invention. However, one of these, SEARCH AXIS: X, Y, ALL, is important to the operation of the markers in the quasi-3-dimensional displays. In these displays, peak searches can be conducted along the time axis, the frequency axis, or both axes. The choices made in this menu determine which axis the searching choices will be performed along. The other choices available in this menu allow the operator to search on troughs instead of peaks, to define a minimum waveform height to qualify as a peak, to cause some averaging between adjacent frequency bins in the peak searching operation, and to define other thresholds.

The user interface described above was implemented in the "C" programming language, running on a UNIX System V operating system, using a 68030 processor. However, none of these implementation details are important to the invention. What is more relevant to the implementation of the preferred embodiment of the invention is the logic of the software's management of the marker information and the relationship between the marker and the color spectrogram display.

The color spectrogram display is generated from information maintained in a circular queue. Each stored spectrum data set includes the following information: center frequency, span, time, frame mark, and first and last valid bin values. When the span is changed, the same center frequency is maintained; therefore this value is stored with each spectrum. In Max Span, what is called the center frequency can move in the window, and thus does not refer to the frequency at the center of the display. The "span" value describes the span at which the spectrum was generated. The "time" value is the number of 50 usec clock cycles that had occurred since the hardware clock was last reset up until the time that this spectrum was generated. The "frame mark" indicates that something changed on the instrument immediately before this spectrum entered the display spectrum queue, and that the change temporarily slowed down the instrument, so that there may be a discontinuity between spectra or other special case concerns with the display of this spectrum. The first valid bin value indicates the first bin on the spectrum that is to be displayed. Similarly, the last valid bin value indicates the last bin of the spectrum that is to be displayed. The primary marker must always stay on the valid part of the spectrum. The bin number of the primary marker will sometimes be changed by the software to comply with this constraint.

The markers are stored separately from the spectra. Each stored marker data set includes the following information: bin, frequency, amplitude, time, and old-y. The "bin" value indicates the position of the marker on the spectrum. The "frequency" and "amplitude" values refer to those of the marker bin. "Time" is the difference between the time of generation of the most recent spectrum and the time of generation of the spectrum on which the marker is currently residing. "Old-y" refers to the present location of the marker relative to the bottom edge of the window.

When a marker is being displayed on a scrolling spectrogram, the software first draws the latest spectrum at the bottom of the display, then scrolls the existing spectrogram display, then increments the marker "old-y" position, then calls a function to update the marker.

The marker update function first finds the current location of the marker within the circular queue of spectra. It next determines whether this spectrum has a "frame mark", indicating an instrument change immediately before this spectrum entered the display and that this spectrum requires special handling. For spectra with a "frame mark", special handling in the marker update function is indicated if the span or frequency changed on this spectrum. If the function is currently handling a primary marker, and a "frame mark" occurs, the marker bin number may need to be adjusted to stay within the first and last valid bin values, and the marker frequency will need adjustment. If a secondary marker is involved, and a "frame mark" occurs, the bin number is set. If this places the marker outside of the display window, the secondary marker display is turned off, although this does not affect the readout of values at the location of the secondary marker or relative to it. If setting the bin number puts a secondary marker that had been outside of a window inside of a window, the display of the secondary marker is turned from off to on. The marker update function then sets the marker time value, and updates the marker's frequency, time, and amplitude if they changed, and the amplitude readout if the amplitude changed and it has been at least 400 msec since the last time it was updated.

In implementing this marker system in a high bandwidth digital spectrum analyzer, the issue of speed is soon encountered. To the extent that superimposing the marker symbols over the color spectrogram display slows down the overall displaying process, less data can be displayed in real time. And, because the display cannot, ultimately, keep up with flow of calculated spectra from the spectrum calculating hardware, time gaps of increasing size appear along the frequency axis at higher speeds of operation, i.e., higher bandwidths. The marker system, by adding to the time required to produce each display, exacerbates this problem.

The approach which successfully minimized this difficulty was instructing the graphics hardware to OR any image to be superimposed on the display with the normal color pixel values for that part of the display, thereby adding an offset to the range of color values and allowing them to all be mapped to any desired alternate color without permanently affecting the underlying image of the spectrogram.

The twelve colors normally used for the spectrogram display are assigned to a range of colors numbered consecutively from a first base number, e.g., the twelve colors are assigned values from $0 \times 40$ to $0 \times 4B$ (hex). The primary marker is then assigned a value of $0 \times 10$ and the secondary marker is assigned a value of $0 \times 20$. For the normal display area, an amplitude value will be coded as one of the numbers in the $0 \times \times 0$ to $0 \times 4B$ range, and different numbers in this range will produce different assigned colors on the screen When the display generating process gets to a portion of the screen where part of a primary marker is to appear, the normal $0 \times 4X$ value of the normal display at that point is ORed with the $0 \times 10$ of the primary marker indication, producing some number in the range $0 \times 50$ and $0 \times 5B$, say $0 \times 5X$. But all numbers in the range $0 \times 50$ to $0 \times 5B$ will have been assigned the same color value, that desired for the primary marker, and that is the color that will be displayed in the region.

A secondary marker indication works the same way. When the number representing the normal color desired at the location of a portion of the secondary marker, something in the $0 \times 40$ to $0 \times 4B$ range, is ORed with the $0 \times 20$ value of the secondary marker, a number in the range of $0 \times 60$ to $0 \times 6B$ results. Again, all numbers in this range are assigned the same color value, that desired for the secondary marker. Similarly, if both markers are superimposed on each other, as well as the normal display for a particular portion of the screen, both a $0 \times 10$ and a $0 \times 20$ are ORed with the normal color indication in the range of $0 \times 40$ to $0 \times 4B$, resulting in a number in the range of $0 \times 70$ to $0 \times 7B$. And, once again, all of the numbers in this range are assigned the same color value, that desired for regions covered by both markers.

This approach allows the underlying color display to be unaffected by the superimposition of the markers, thereby avoiding the problem of reconstituting the display when the marker moves to another location or this portion of the normal display is shifted away from the static location of the marker. If graphics hardware had been used which could internally handle the superimposing of two images without destroying either of them, this pixel color bit ORing approach would not have been necessary. However, since this type of hardware was not available within the system within which this invention first found its embodiment, the approach described is the approach that was used to implement the invention.

Color spectrograms are a simple and effective invention could work with other similar quasi-3-dimensional displays such as a binary video display or a waterfall display. A binary video display resembles a color spectrogram, but instead of showing a number of amplitude levels by the use of color it shows only whether the amplitude at a particular point was above or below a binary threshold.

Figure 4:
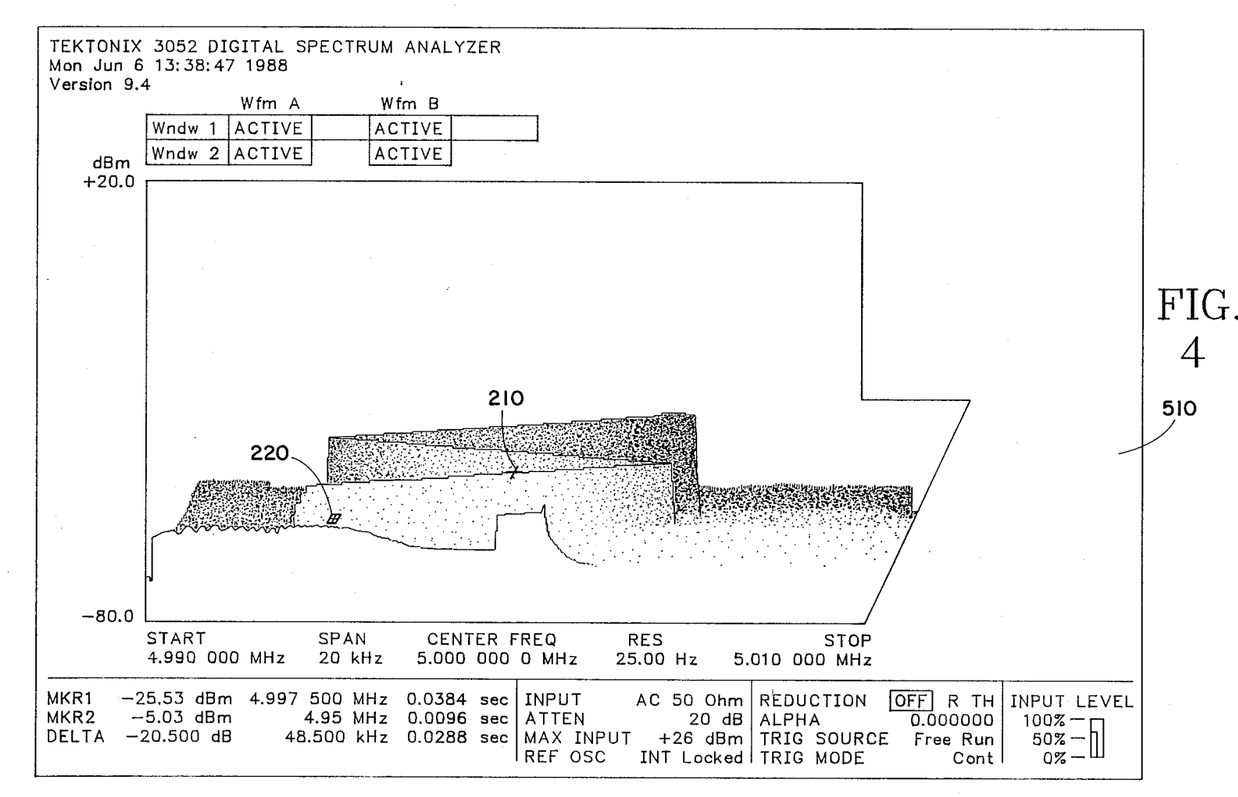
FIG. 4 is an illustration of a waterfall display of multiple spectra with the primary and secondary markers disposed thereon.

Referring now to FIG. 4, a waterfall display contains contains a number of amplitude versus frequency graphs stacked closely together so that trends may be readily observed and comparisons made. Each amplitude versus frequency graph is displaced two pixels upward and one to the right relative to the one "in front of" it. Thus, older graphs recede into the display. This effect is enhanced by having the individual graphs lose their intensity as they fade into the background of the display, until they slip into darkness at the rear.

The markers 210 and 220 in this display ride along on the terrain of the particular spectrum that they are on, so that the visual appearance of their location and their actual location in the two dimensions of frequency and time are different. This difference is produced by adding the value of the amplitude at the location of the marker to the y-axis value of the baseline of the graph that it is riding on. The markers are drawn so as to appear parallel to the plane of the false 3-dimensional "fade axis" 510 and do not conform themselves to the terrain that they are riding on. Markers are superimposed on the display in the same way for the waterfall display as they were for the color spectrogram display.

We claim:

1. A method for obtaining data from a quasi-3-dimensional display of multiple spectra in an electronic spectrum analysis instrument, comprising the steps of:
    displaying a plurality of spectra in a quasi-3-dimensional display of amplitude, time, and frequency;
    movably disposing a marker in the quasi-3-dimensional display;
    moving the marker under operator control to a point of interest;
    ascertaining the values of the amplitude, time, and frequency at the current location of the marker;
    presenting for readout the ascertained values;
    movably disposing a second marker within the quasi-3-dimensional display;
    moving the second marker under operator control to a second point of interest;

ascertaining the values of the amplitude, time, and frequency at the current location of the second marker;

presenting for readout the ascertained values for the second marker; and indicating the differences between the ascertained values for the point of interest and the second point of interest.

2. A display apparatus for an electronic spectrum analysis instrument, comprising:

means for displaying a plurality of frequency spectra represented by the three parameters of time, frequency, and amplitude in a quasi-3-dimensional form;

a marker movably disposed within the displaying means;

means for moving the marker in two dimensions according to operator inputs;

means for ascertaining the values of the three parameters at the current location of the marker;

means for reading out the ascertained values of the three parameters at the current marker location;

a second marker movably disposed within the displaying means;

means for ascertaining the values of the three parameters at the current location of the second marker;

means for reading out the ascertained values of the three parameters at the current second marker location;

means for determining which marker is subject to control by the marker moving means at a particular time so that the operator may alternately control both markers with the moving means; and means for indicating differences in the values of the three parameters between the location of the marker and the location of the second marker.

3. A display apparatus as recited in claim 2 wherein the displaying means is color spectrogram.

4. A display apparatus as recited in claim 2 wherein the displaying means is a waterfall display.

5. An improved electronic spectrum analysis instrument of the type having means for analyzing the spectral content of a time varying electronic signal and means for displaying a quasi-3-dimensional representation of multiple frequency spectra, wherein the improvement comprises a first marker on the quasi-3-dimensional multiple spectra displaying means that is operable by the user to identify a particular point in the display and which provides a readout of the amplitude, time, and frequency values associated with the identified point, a second marker on the quasi-3-dimensional multiple spectra displaying means that is operable by the user to identify a second particular point in the display and which provides a readout of the amplitude, time, and frequency values associated with the second particular point, and a readout of the difference in amplitude, time, and frequency values between the particular point and the second particular point.

* * * * *